(12) United States Patent
Beck et al.

(10) Patent No.: US 10,732,247 B2
(45) Date of Patent: Aug. 4, 2020

(54) METHOD AND MAGNETIC RESONANCE APPARATUS FOR RECALCULATING A WEIGHTING MATRIX IN THE EVENT OF PATIENT MOTION

(71) Applicant: Siemens Healthcare GmbH, Erlangen (DE)

(72) Inventors: Thomas Beck, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 190 days.

(21) Appl. No.: 15/884,762

(22) Filed: Jan. 31, 2018

(65) Prior Publication Data

US 2018/0217219 A1 Aug. 2, 2018

(30) Foreign Application Priority Data

Jan. 31, 2017 (DE) .......................... 10 2017 201 477

(51) Int. Cl.
*G01R 33/565* (2006.01)
*G01R 33/561* (2006.01)
(Continued)

(52) U.S. Cl.
CPC ..... *G01R 33/56509* (2013.01); *G01R 33/283* (2013.01); *G01R 33/4835* (2013.01); *G01R 33/5611* (2013.01)

(58) Field of Classification Search
CPC .......... G01R 33/56509; G01R 33/5676; G01R 33/283; G01R 33/4835
(Continued)

(56) References Cited

U.S. PATENT DOCUMENTS 6,373,250 B1 * 4/2002 Tsoref .................. G01R 33/446
324/307
7,432,710 B2 * 10/2008 Takei ................. G01R 33/5676
324/318
(Continued)

FOREIGN PATENT DOCUMENTS

DE 102017201477 A1 * 8/2018 ....... G01R 33/56509

OTHER PUBLICATIONS

Thesan et al., "Prospective Acquisition Correction for Head Motion With Image-Based Tracking for Real-Time fMRI," Magnetic Resonance in Medicine, vol. 44, pp. 457-465 (2000).
(Continued)

*Primary Examiner* — Dixomara Vargas
*Assistant Examiner* — Sean Curtis
(74) *Attorney, Agent, or Firm* — Schiff Hardin LLP (57) ABSTRACT

In a method and apparatus for creating MR images of an examination volume, MR reference data of the examination volume are determined, and a local weighting matrix is determined using the MR reference data in order to extract MR data of the examination volume from MR signals measured in accelerated fashion with the local weighting matrix. Motion of the examination volume is determined while the MR signals measured in accelerated fashion from the examination volume are detected, whereby, if an adaptation of the reconstruction process is required when taking into consideration the determined motion, this proceeds by recalculation of the local weighting matrix taking into consideration the determined motion for correction of the determined motion, and application of the recalculated weighting matrix during the creation of the MR images which are calculated on the basis of the MR signals measured in accelerated fashion.

14 Claims, 6 Drawing Sheets

(51) Int. Cl.
*G01R 33/28* (2006.01)
*G01R 33/483* (2006.01)

(58) Field of Classification Search
USPC .................................................. 324/300–324
See application file for complete search history.

(56) References Cited

U.S. PATENT DOCUMENTS

| | | | |
|---|---|---|---|
| 7,511,489 B2* | 3/2009 | Fautz | G01R 33/5611 |
| | | | 324/307 |
| 9,453,898 B2* | 9/2016 | Nielsen | G01R 33/58 |
| 10,156,623 B2* | 12/2018 | Nielsen | G01R 33/56509 |
| 2006/0261810 A1* | 11/2006 | Fautz | G01R 33/5611 |
| | | | 324/309 |
| 2007/0080690 A1* | 4/2007 | Takei | G01R 33/5676 |
| | | | 324/318 |
| 2014/0055135 A1* | 2/2014 | Nielsen | G01R 33/58 |
| | | | 324/309 |
| 2015/0212182 A1* | 7/2015 | Nielsen | G01R 33/56509 |
| | | | 702/191 |
| 2017/0146631 A1* | 5/2017 | Beck | G01R 33/4833 |
| 2018/0217219 A1* | 8/2018 | Beck | G01R 33/283 |
| 2018/0246182 A1* | 8/2018 | Carinci | G01R 33/543 |
| 2019/0094321 A1* | 3/2019 | Carinci | G01R 33/583 |
| 2020/0088826 A1* | 3/2020 | Zeller | G01R 33/5618 |

OTHER PUBLICATIONS

Polimeni et al., "Reducing Sensitivity Losses Due to Respiration and Motion in Accelerated Echo Planar Imaging by Reordering the Autocalibration Data Acquisition," Magnetic Resonance in Medicine, vol. 75, pp. 665-679 (2016).

Breuer et al., "Controlled Aliasing in Parallel Imaging Results in Higher Acceleration (CAIPIRINHA) for Multi-Slice Imaging," Magnetic Resonance in Medicine, Vo. 53, pp. 684-691 (2005).

Bhat et al., "Motion Insensitive ACS Acquisition Method for in-plane and Simultaneous Multi-Slice Accelerated EPI," Proc. Intl. Soc. Mag. Reson. Med., vol. 22, p. 0644 (2014).

Larkman et al., "Use of Multicoil Arrays for Separation of Signal from Multiple Slices Simultaneously Excited," Journal of Magnetic Resonance Imaging, vol. 13, pp. 313-317 (2001).

Souza et al., "SIMA: Simultaneous Multislice Acquisition of MR Images by Hadamard-Encoded Excitation," Journal of Computer Assisted Tomography, vol. 12, No. 6, pp. 1026-1030 (1988).

Breuer, et al.. "Dynamic Autocalibrated Parallel Imaging using TGRAPPA" Proc. Intl. Soc. Mag. Reson. Med., vol. 11, p. 2330, (2003).

Breuer et al. "Dynamic Autocalibrated Parallel Imaging Using Temporal GRAPPA (TGRAPPA)",Magnetic Resonance in Medicine, vol. 53, pp. 981-985, (2005).

* cited by examiner

METHOD AND MAGNETIC RESONANCE APPARATUS FOR RECALCULATING A WEIGHTING MATRIX IN THE EVENT OF PATIENT MOTION

BACKGROUND OF THE INVENTION

Field of the Invention

The invention concerns a method for creating MR images of an examination volume of a subject, an MR system for implementing such a method, and a non-transitory, electronically readable data storage medium for implementing such a method.

Description of the Prior Art

Accelerated MR imaging methods are known in which a slice-based acceleration procedure is used in order to reduce the duration of measurement that is required. With this procedure, also referred to as simultaneous multi-slice, SMS, slice acceleration or multiband, a number of slices are simultaneously excited and read out. For example, with an acceleration factor of 3 the required repetition time TR can be reduced by a factor of 3. Accordingly, it is possible in the case of functional imaging or in the case of diffusion imaging with the use of echoplanar imaging techniques, to reduce the time needed in order to acquire a complete slice volume to one third of the time that would otherwise be required. The reduction in the measuring time or the improvement in the temporal sampling rate is considered to be the principal advantage of such methods. The simultaneous excitation of a number of slices causes a superimposition of all the excited slices in the received signals, which means that the slices must be separated from one another again in the context of the image reconstruction. SMS is typically used in the case of time series, for example in the case of functional imaging in which a number of repetitions are recorded with the same contrast, or in the case of diffusion imaging in which a number of repetitions are recorded with partially differing contrasts.

For the subsequent separation of the slices, an additional reference measurement is usually necessary, in which an entire slice package is acquired as a whole in a single scan. The slice positions and the number of slices are identical in the reference measurement scan and in the actual imaging measurement scan. The reference measurement can also be recorded with a recording sequence different from the imaging measurement, but a similar contrast is preferably used.

A slice separation matrix, also called a slice separation kernel, is employed for slice separation in the time series of the subsequent imaging method, and is then trained to the reference data set. Such slice separation kernels are then used for the entire subsequent image sequence recording. Motion of the person under examination in this situation may result in spatial displacements or in the rotation of the examination volume, which means that the image data recorded in a time sequence do not spatially match the spatial properties of the reference measurement.

Figure 2:
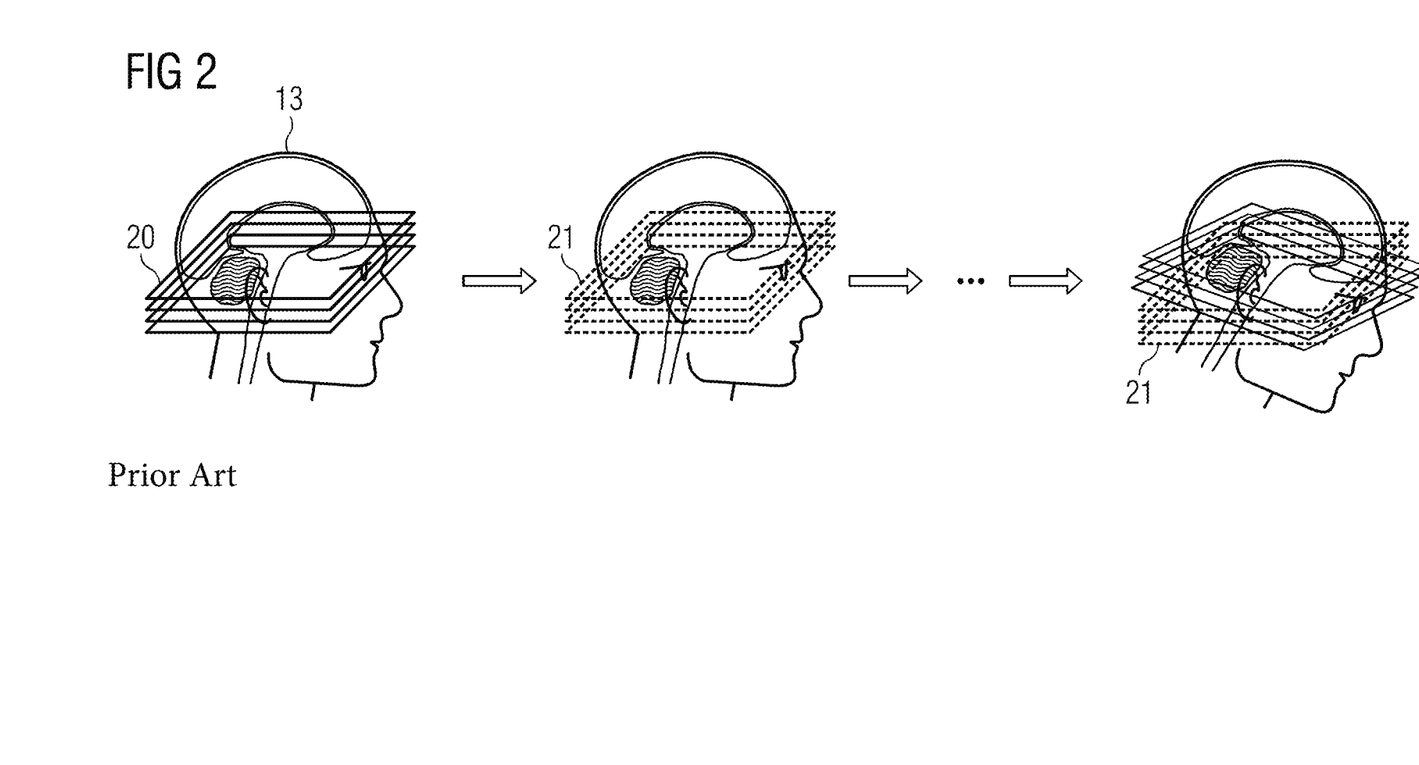
FIG. 2 schematically shows how, according to the prior art, motion of a person under examination can have a negative influence on a calculation of a slice separation matrix after recording of the reference data.

It is known to perform a motion compensation, prospective or retrospective, on the basis of the reconstructed image data. In retrospective correction, the reconstructed image data of the individual time series are registered with each other on the basis of the examined anatomy, for example the head. In prospective correction, registration of the existing time series likewise takes place, and the subsequent image volumes are then excited directly during the imaging, displaced in space by the ascertained motion correction coordinates, and recorded. The results of the time series are nevertheless affected by artifacts, which is problematic with regard to making an intensity comparison of the images between the points in time, because variations in intensity may then possibly be motion-related and not the cause of a changed diffusion or other activity. This is illustrated schematically in FIG. 2. Reference data from a person 13 under examination are recorded in a reference volume 20. In this recording in the reference volume 20, an unaccelerated data acquisition takes place, meaning that data from each slice are measured (detected) individually, possibly by multiple reception coils. An accelerated measurement is subsequently performed on an examination volume 21, wherein the slice positions match the slice positions of the reference volume 20 when there is no motion of the person under examination. If the person now moves (shown in the right part of FIG. 2), then spatially fixed imaging slices of the examination volume 21 contain changed anatomy. Furthermore, changed coil sensitivity profiles are present as a result of the motion. Even if an attempt is made to perform the motion compensation on the basis of reconstructed image data, the slice separation kernel calculated using the reference measurement is nevertheless applied to the accelerated measurement in the examination volume 21 in order to enable the measured data to be decomposed into the individual slices. Motion of the patient during the measurement, however, does have an influence on the slice separation kernel, which has been determined on the basis of another position of the object under examination.

Such a problem occurs not only when using the slice separation kernel, but also in the case of parallel imaging, such as GRAPPA, when coefficients are calculated with the use of a reference measurement in order to combine unrecorded raw data points from recorded raw data points by linear combination.

The calculation of the associated weighting matrix for the position of the object under examination also takes place in such an application.

SUMMARY OF THE INVENTION

An object of the present invention is to improve an accelerated imaging method and in particular to reduce the artifacts in the event of motion of the object under examination when such a weighting matrix is used as a slice separation matrix, or as the matrix for the determination of non-measured raw data points.

According to a first aspect of the invention, a method for creating MR images of an examination volume includes acquiring, or providing MR reference data to a computer, at least of the examination volume, and a local weighting matrix is determined in the computer by using the MR reference data in order to extract MR data of the examination volume from MR signals measured in accelerated fashion in the slice direction with the local weighting matrix. Furthermore, motion of the examination volume is determined while the MR signals measured in accelerated fashion from the examination volume are detected. If the motion in this situation is greater than a limit value, a recalculation of the local weighting matrix takes place, taking into consideration the determined motion in order to minimize artifacts caused by the motion because the newly calculated weighting matrix is used when creating the MR images of the examination volume. The MR images are calculated on the basis of the MR signals measured in this accelerated fashion. The MR images (image data) are made available from the computer as a data file.

As a result of the detection of the motion and the possible recalculation of the local weighting matrix, motion of the examination volume can be taken into consideration that occur during detection of the MR signals recorded in accelerated fashion. This means that a weighting matrix calculated on a single occasion is not used independently of the motion, but rather the weighting matrix depends on the motion of the examination volume. A deviation between the volume in which the MR reference data have been recorded, and the examination volume in which the MR signals are measured in accelerated fashion, can be taken into consideration.

The MR signals measured in accelerated fashion of the examination volume can be recorded in a number of slices, in which case the determined motion is corrected such that an anatomical structure remains unchanged in each slice, in the multiple initial slices, before the motion correction and in recalculated slices after the motion correction. The local weighting matrix is thus recalculated such that the multiple slices in each case exhibit essentially the same anatomy or the same structure before and after the correction. It is thus possible to form a time series of the individual slices and to compare the signal intensities with each other, because this ensures that the same anatomical structures are compared or that the compared anatomical structure, which is represented in the individual pixels of the initial slices, does not change.

Preferably the multiple slices recorded during the determination of the MR reference data are recorded individually and, during the determination of the MR signals measured in accelerated fashion, the multiple slices are measured simultaneously using a number of reception coils. It is thereby possible to subsequently determine the local weighting matrix which is then used in the case of the MR signals measured in accelerated fashion.

The local weighting matrix can be a slice separation matrix, as was mentioned above, by which the MR signals measured in accelerated fashion in the slice direction from a number of slices, which were detected by a number of reception coils, can be associated with the individual slices. Furthermore, the local weighting matrix can be used in the case of parallel imaging in order to reconstruct non-measured raw data points of the object under examination from MR signals measured in accelerated fashion with the use of the local weighting matrix.

The motion of the examination volume following completion of the measurement of the MR signals measured in accelerated fashion can be detected. It is also possible to determine the motion of the examination volume prior to completion of the measurement of the MR signals measured in accelerated fashion, and to take into consideration at least some of the MR signals measured in accelerated fashion during the reconstruction of the MR images that are calculated with the use of the MR signals measured in accelerated fashion.

Furthermore, the MR signals measured in accelerated fashion may be used in order to determine the motion of an anatomy represented in the examination volume. A further possibility for determining the motion of the examination volume is the use of images that have been recorded with cameras or the use of other MR signals.

The MR signals measured in accelerated fashion can be recorded in order to determine a temporal profile of an MR signal parameter in a section of the examination volume, for example a diffusion parameter or the signal intensity as in the case of functional imaging.

The examination volume furthermore can be adjusted depending on the determined motion before the recording of the MR signals measured in accelerated fashion is terminated, in which case at least part of the recording of the MR signals measured in accelerated fashion then takes place using the adjusted examination volume. With this prospective correction, the tracking of the slice position takes place during the recording of the MR signals measured in accelerated fashion. A recalculation of the local weighting matrix does not necessarily need to take place before the end of recording the MR signals measured in accelerated fashion, but can take place following the measurement, for example in order to separate the slice information or to calculate the missing raw data points in the case of parallel imaging. It is furthermore possible to use a first MR measurement in order to ascertain whether motion of the examination volume is present at all. If this is the case, a second MR measurement can take place, for example a navigator measurement, in order to then quantify the motion. This further reduces the time requirement for the determination of the motion, because the second MR measurement, which is needed in order to quantify the motion, only needs to be performed if it is actually possible to ascertain on the basis of the first MR measurement, which is normally shorter than the second MR measurement whether the second MR measurement is necessary. The first measurement is normally shorter than the second measurement, thereby further facilitating the inventive method.

Preferably a reference volume, in which the reference data are recorded, is larger than the examination volume, which means that in the event of motion, the recalculated slices are still always contained in the reference volume, which means that the local weighting matrix can be recalculated completely and correctly.

Furthermore, the invention encompasses an MR apparatus that is operable as described above. The MR apparatus has a control computer, a scanner and a memory. The memory stores executable control information, and the MR apparatus is designed to perform the steps described above when the control information is executed in the control computer.

The present invention also encompasses a non-transitory, computer-readable data storage medium encoded with programming instructions that, when the storage medium is loaded into a computer or (distributively) into a computer system of a magnetic resonance apparatus, cause the computer or computer system to operate the magnetic resonance apparatus so as to implement any or all embodiments of the method in accordance with the invention, as described above.

The features described above and the features described below can be used not only in the correspondingly explicitly stated combinations but also in other combinations, unless explicitly stated otherwise. Furthermore, the various features can be used individually without departing from the scope of the invention.

DESCRIPTION OF THE PREFERRED EMBODIMENTS

The same or similar elements in the figures are identified by the same reference characters. Furthermore, the figures represent schematic illustrations of various embodiments of the invention. The elements illustrated in the figures are not necessarily illustrated to scale and are rather reproduced in such a manner that the function and the purpose of the elements illustrated are rendered understandable. The connections illustrated in the figures between functional units or other elements can also be implemented as indirect connections, where a connection can be made in wireless or wired fashion. Functional units can be implemented as hardware, software or a combination of hardware and software.

Figure 1:
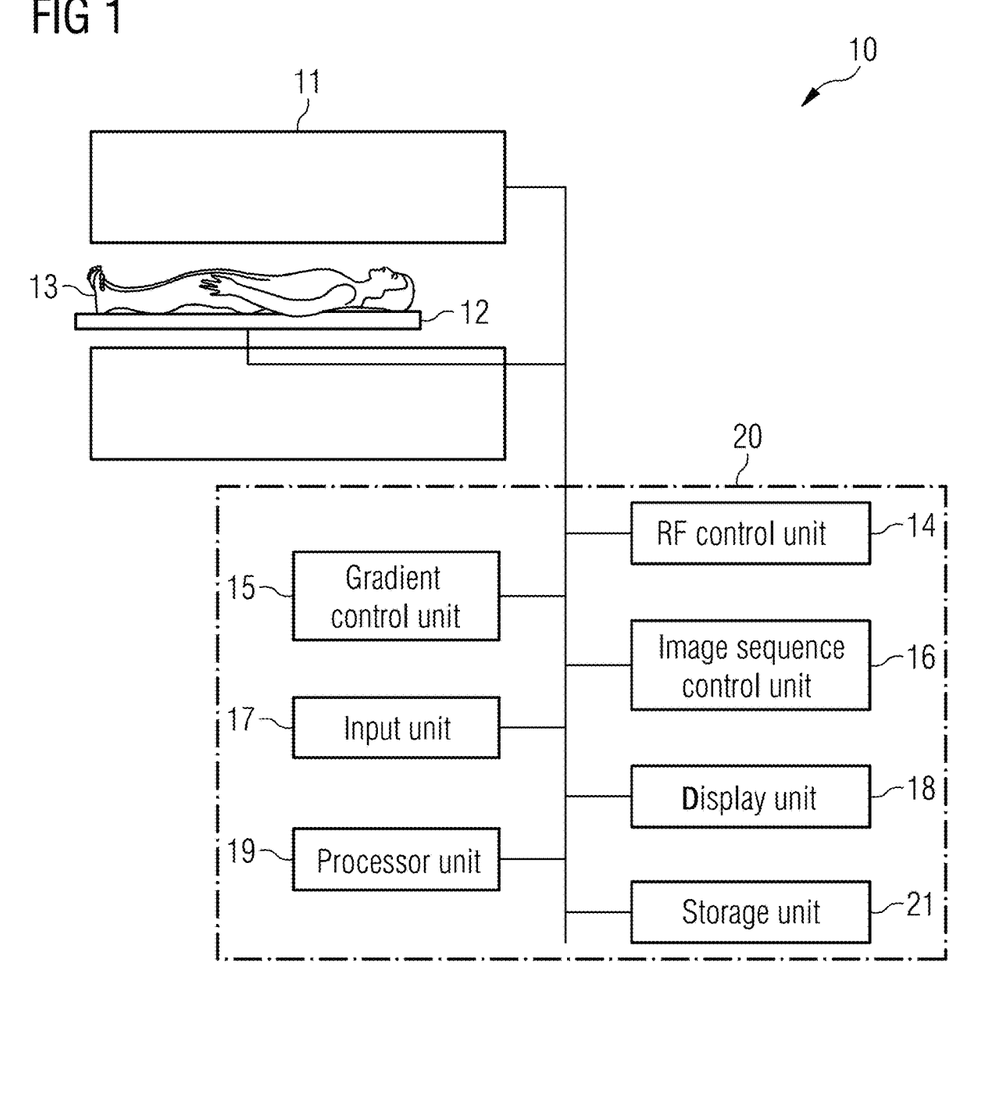
FIG. 1 schematically illustrates an MR apparatus with which the method according to the invention is performed.

With reference to FIG. 1 an MR apparatus is explained with which, as described in the following, a local weighting matrix is recalculated in the event of motion of the object under examination. The MR apparatus 10 has a scanner 11 that has a basic field magnet that generates a polarization field BO, where a person under examination 13 arranged on a patient table 12 is introduced so that spatially-encoded magnetic resonance signals from the person under examination 13 can be recorded. The coils used for signal recording, such as a whole-body coil or a number of local coils, are not illustrated for clarity. The invention can be used for recording MR signals in accelerated fashion, where the MR signals are recorded simultaneously by multiple local coils, i.e. a coil array of local coils. By radiating with radio-frequency pulses and switching magnetic field gradients, the magnetization generated by the polarization field BO is deflected from the state of equilibrium and spatially-encoded, and the resulting transverse magnetization is detected by the reception coils. The generation of MR images by radiating RF pulses and switching magnetic field gradients in various combinations and sequences is known to those skilled in the art, and thus need not be described in more detail herein.

The MR system furthermore has a control computer 20 that controls the MR apparatus 10. The control computer 20 has an RF controller 14 for controlling and generating the RF pulses in order to deflect the magnetization. A gradient controller 15 is provided for controlling and switching the necessary magnetic field gradients. An image sequence controller 16 controls the sequence of the magnetic field gradients and of the RF pulses, and thereby indirectly the gradient controller 15 and the RF controller 14. An operator can control the MR system via an input unit 17, and MR images and other information needed for control purpose can be displayed on a display unit 18. A processor 19 can be provided in order to coordinate and control the various units in the control computer 20. Program modules or programs can be stored in a memory 21 when executed by the processor 19. The stored program code cause the MR apparatus to operate as will be explained in detail below.

Figure 3:
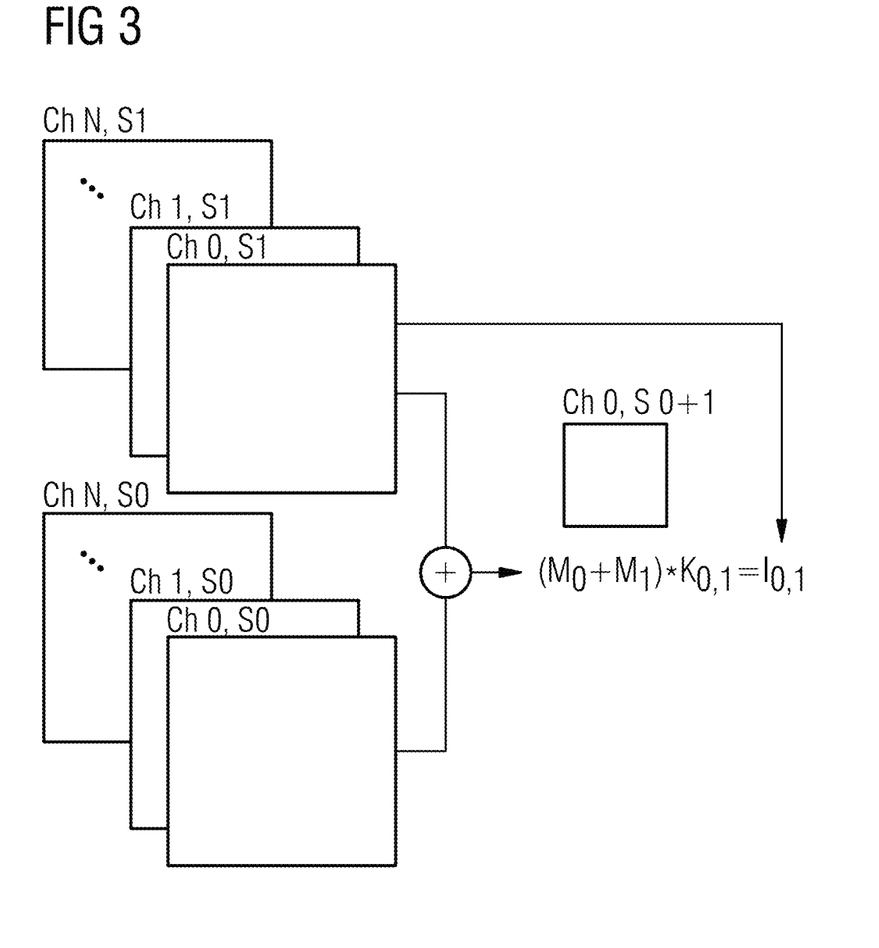
FIG. 3 schematically explains how a slice separation matrix can be calculated with the use of the reference data, where the individual slices were recorded individually.

FIG. 3 provides a general explanation as to how a slice separation matrix K can be calculated from reference data. To this end, the various slices S0, S1, S2 are recorded via the various reception channels. The reference data are recorded in total, and not accelerated in the slice direction, where each slice is measured individually via the various reception channels. This means that each slice S is measured using the coil channels Ch 1 to Ch N, and the slices S subsequently combined using the known CAIPIRINHA displacement pattern so as to form an artificially superimposed signal M0+M1. The accelerated MR signals acquired at a later point in time can thereby be generated artificially from the reference data. The magnetizations M0 and M1 are the magnetization that occur in the slices M0 and M1. Furthermore, the results of the reconstructed signal of each slice are known because they have been measured, where $I_{0,1}$ means that the signal intensity in slice 1 has been measured using the coil 0. The sole remaining unknown is thus the slice separation matrix K which then specifies which portions from the superimposed mixed signal correspond to the portions of the individual slices. It is therefore generally possible to calculate the slice separation matrix with the use of the reference data. It is similarly possible in the case of parallel imaging to reconstruct missing non-measured raw data points with the use of reference data, as is known through parallel operating techniques such as GRAPPA or SENSE.

Figure 4:
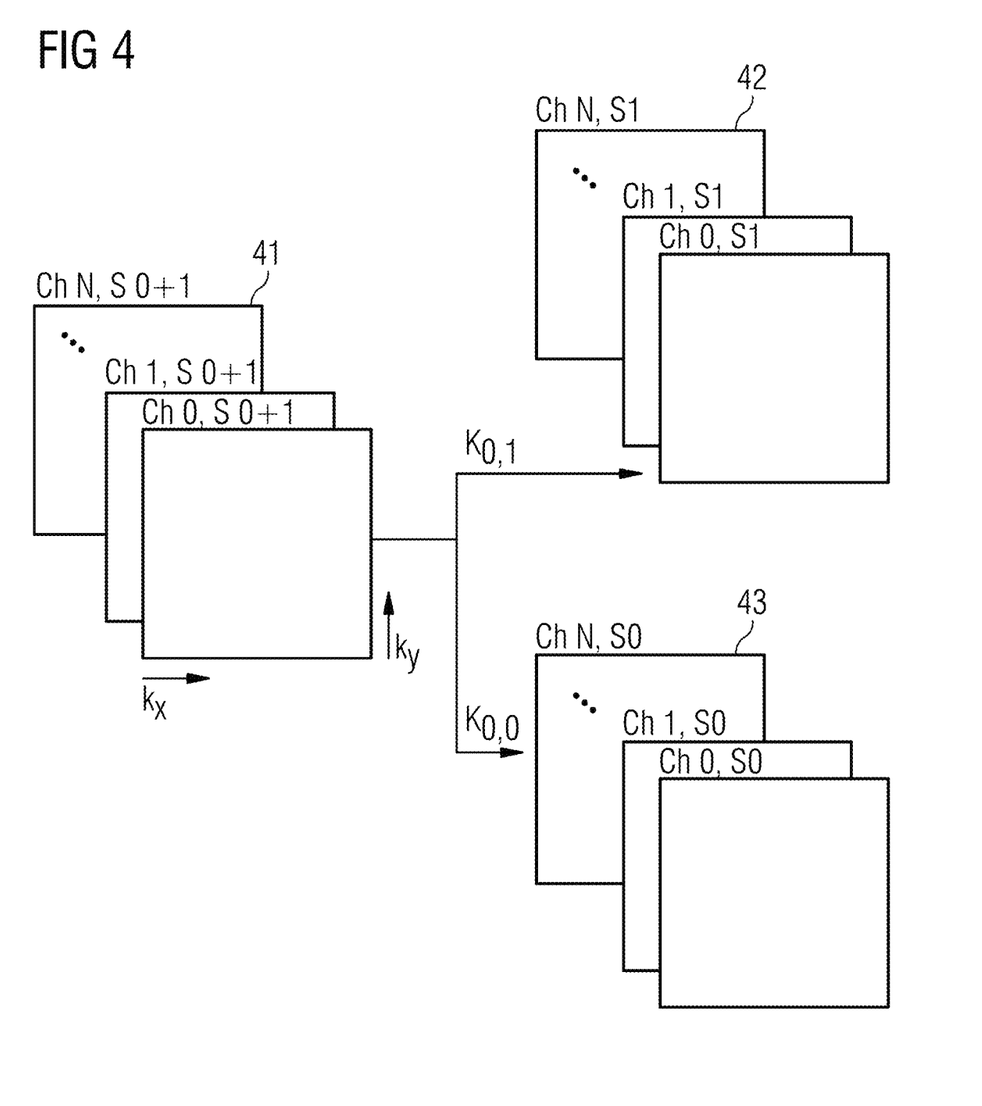
FIG. 4 schematically shows how the signals can be associated with individual slices with the use of the calculated slice separation matrix.

FIG. 4 shows how the slice separation matrix K can be applied to MR signals measured in accelerated fashion. The MR signals measured in accelerated fashion comprise a plurality of data sets 41, where each data set signifies one reception channel. Each data set 41 contains signals from a number of slices. Through the use of the slice separation matrix K, it is possible to generate data sets 42 and 43 in which the signals of each individual slice, which have contributed to the overall signal, are individually calculated separately for each channel.

Figure 5:
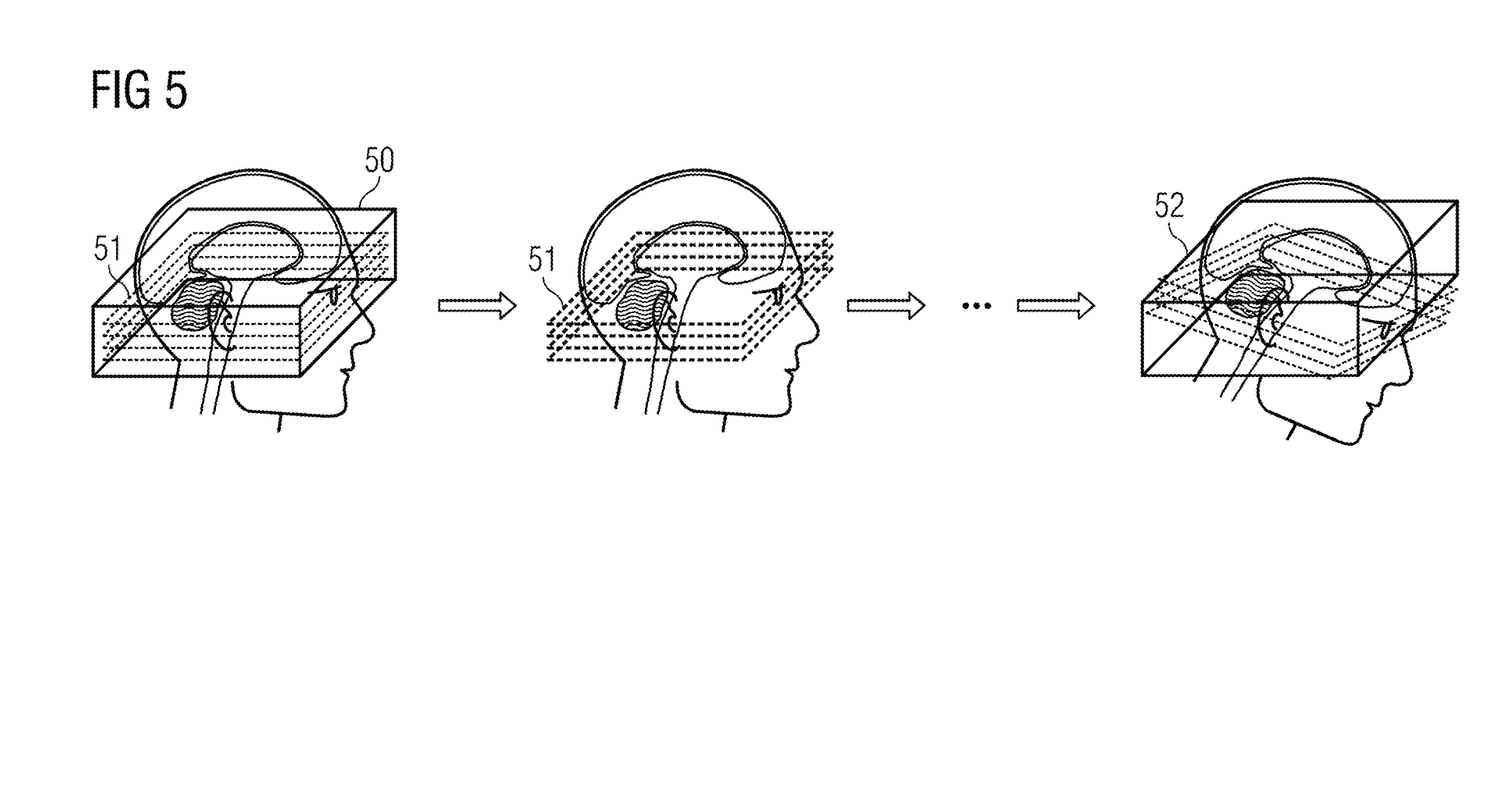
FIG. 5 schematically shows how motion of the patient can be taken into consideration according to the invention, through recalculation of the slice separation matrix.

FIG. 5 and the explanation below describe how motion of the examination volume can be taken into consideration during the calculation of the slice separation matrix. As is illustrated in the left part in FIG. 5, a reference data set 50 is recorded. This reference data set 50 is preferably larger than the actual examination volume 51 of which MR images are to be generated later with the use of accelerated methods. The examination volume 51 is contained in the reference volume 50. It is possible, but not compulsory, to record the reference data with isotropic resolution, which means that the resolution is equal in all directions. Subsequently it is possible, as explained in conjunction with FIGS. 3 and 4, to calculate the slice separation matrix. Furthermore, the accelerated imaging of the MR signals in the examination volume 51 can be started. In parallel or interleaved therewith with the individual repetitions of the accelerated imaging the motion of the examination volume can be determined, for example by short navigator measurements between the individual repetitions, or with the use of images which were recorded using cameras or by the use of field examinations or by analysis of the recorded imaging data itself which is recorded during the accelerated measurement of the examination volume 51. As can be seen in FIG. 5, the slice positions of the examination volume 51 match the slice positions in the reference volume. If a motion of the patient takes place, however, then the slices of the same anatomical structures are situated in recalculated slices 52, which no longer match the slice position in the examination volume

51. This motion can now be taken into consideration as follows. When the slice separation matrix is being recalculated, the positions of the recalculated slices are now determined, and the slice separation matrix is determined on the basis of the recalculated slices, as was explained in conjunction with FIGS. 3 and 4.

In the case of a purely retrospective detection and determination of the motion, for example on the basis of the recorded image data, motion parameters can be extracted on a volume basis in the image space or raw data space by the use of known techniques from the recorded image data of the examination volume. If the motion parameters exhibit a certain offset from a reference position, a recalculation of the slice separation matrix takes place. In this situation the reference position can correspond to the position at which the reference data was recorded. In this situation the reference data of the reference volume 50 is interpolated to the new slice positions 52 of FIG. 5. This means that the steps described in conjunction with FIGS. 3 and 4 are now repeated for recalculated slices 52, as illustrated in the right part of FIG. 5.

The recalculated slice position matrix can then be used for the subsequent image reconstruction of the accelerated imaging, for example until another motion is detected which is greater than a limit value. In this situation the limit value can be a predetermined translation and/or rotation value. It is furthermore possible for the limit value to be the result of a function. For example, the determined motion of the anatomical structure in the examination volume can be filtered in a filter, such as a Kalman filter, in order to obtain a motion behavior over time. In this case the limit value is then not a fixed value but variable in time. Furthermore, further parameters can be incorporated into the function that determines the limit value, such as the remaining duration of measurement of the accelerated MR measurement or the time since the last update of the weighting matrix. As the time interval from the last update increases, for example the limit value as of which a recalculation of the weighting matrix takes place, can be reduced. If the remaining measuring time becomes less, the limit value is increased in order to avoid a recalculation if the remaining residual measuring time is so low that a recalculation relates only to a very small part of the recorded raw data.

If the motion is greater than the limit value, the above recalculation of the slice separation matrix is repeated. This method has the advantage that the slice separation matrix is calculated such on the basis of the current slice position that slice separation artifacts occurring are minimized. With regard to this retrospective detection, the actual accelerated imaging sequence is not influenced.

Furthermore, a prospective correction is possible. During the measurement of the imaging volume 51 the motion and the motion parameters can be determined for example by means of external sensors or by means of FID navigators. Knowledge of the acquired image information is not required in order to determine the motion parameters. Tracking of the slice position takes place for the accelerated measurement on the basis of the detected and quantified motion. No separation of the slice information using the slice separation matrix takes place at this point in time. Subsequent to the measurement, updating of the slice separation matrix is performed on the basis of the motion information and used in order to separate the slice information. In contrast to the retrospective method, in this case tracking of the slice position is performed actually during the measurement of the accelerated MR signals. The required interpolation of the image information is thereby reduced significantly. The very intensive recalculation of the slice separation kernels does not necessarily need to be performed during the measurement of the accelerated imaging.

It is furthermore possible to use the image data in order to determine the motion information. In this case, however, the recalculation of the slice separation matrix should take place in timely fashion without the further process of the measurement of the MR signals measured in accelerated fashion being impaired. For example, it is possible to detect on the basis of very short MR sequence portions whether motion takes place, but no quantification of the motion yet takes place on account of this first MR sequence. This is possible, for example, by a comparison of non-phase-encoded navigator lines, the use of inversion pulses, etc. When motion is detected, a second MR sequence then take place, for example a more detailed navigator, which permits the quantification of the motion.

The invention was explained above with reference to the slice separation matrix. The invention can also be applied to the calculation of missing raw data lines in the case of parallel imaging where coefficients are calculated with the use of the reference data in order to reconstruct raw data points not recorded during the accelerated measurement from raw data points of the accelerated measurement.

Figure 6:
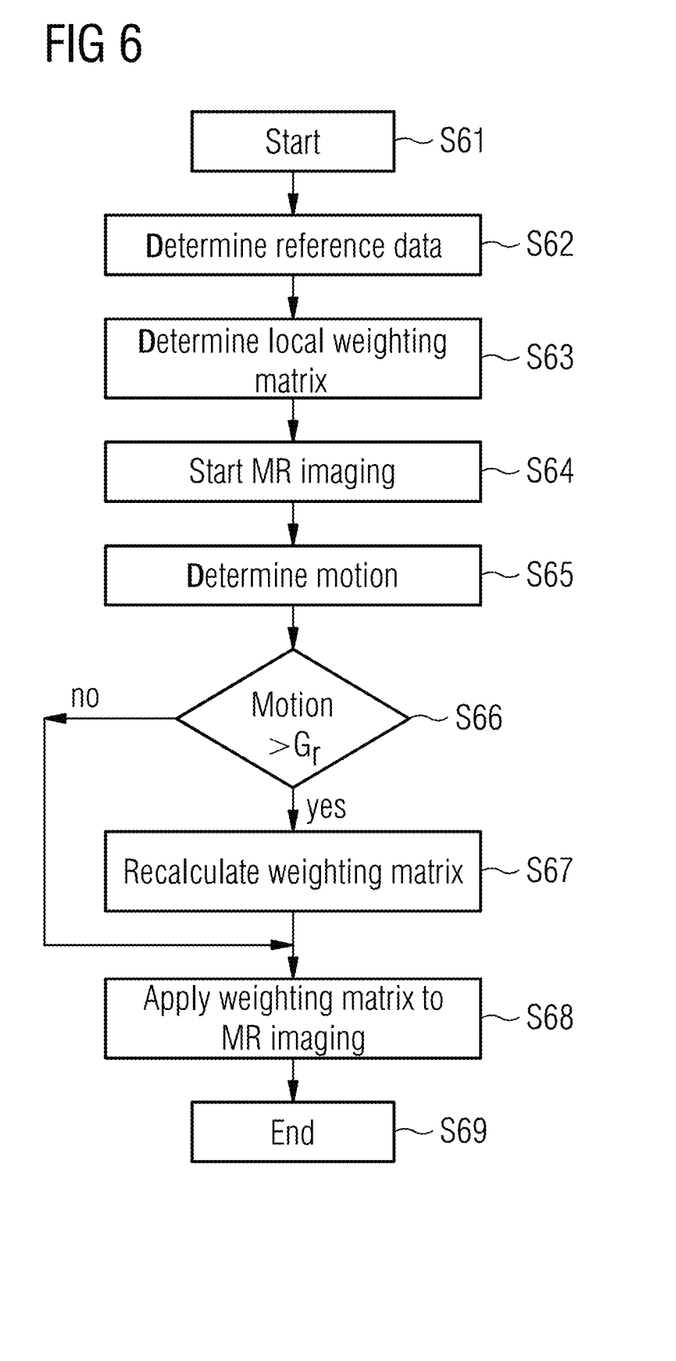
FIG. 6 is a flowchart that schematically shows the steps with which a local weighting matrix, such as the slice separation matrix, can be recalculated in the event of motion.

In FIG. 6 a number of steps are summarized, which can be performed for the recalculation of the weighting matrix. In this situation the sequence of the steps shown in FIG. 6 is not determined by the sequence illustrated; individual steps can be performed in parallel or in another order.

The method starts in step S61, and in step S62 the reference data are determined in the reference volume, for example the volume 50. The local weighting matrix can then be calculated therefrom in a step S63, wherein the local weighting matrix can be the slice separation matrix or the matrix with the coefficients of the linear combination in the case of parallel imaging. The start of the accelerated MR imaging furthermore takes place in a step S64. During the accelerated MR imaging the determination of the motion takes place in step S65. As explained above, various possibilities are conceivable for this purpose, either the determination of the motion with external sensors or the determination of the motion on the basis of the recorded image data. In step S66 a check is then made as to whether the motion is greater than a limit value $G_r$. As explained previously, the limit value is not necessarily a fixed predetermined static value but can vary with time and can itself be the result of a calculation using a function. If the motion is greater than the limit value, a recalculation of the weighting matrix takes place in step S67. In this situation an interpolation of the recalculated slices 52 from FIG. 5 first takes place from the reference volume and then the calculation of the new weighting matrix on the basis of the recalculated slices. The recalculated weighting matrix can subsequently be applied in step S67 to the accelerated MR imaging, either before completion of this imaging or after completion of this imaging (step S68). The method ends in step S69.

As explained above, a dynamic recalculation of the weighting matrix can take place on the basis of the detected motion. This offers an enhanced robustness against patient motions when recording time series. The image quality is improved by avoiding artifacts and end time series of different tissues are prevented from being compared with one another.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for generating magnetic resonance (MR) images of an examination volume of a subject, comprising:
   with a computer, operating an MR data acquisition scanner to acquire MR reference data of an examination volume of a subject while the subject is situated in the MR data acquisition scanner;
   with said computer, operating said MR data acquisition scanner to acquire measured MR signals from said examination volume with an accelerated MR data acquisition procedure that is accelerated in a slice direction;
   in said computer, using said MR reference data to determine a local weighting matrix, and using the local weighting matrix to extract MR data from the examination volume from the measured MR signals;
   detecting motion of the examination volume while the measured MR signals are being acquired from the examination volume, and determining whether said motion is larger than a limit value;
   dependent on whether the detected motion is greater than said limit value, recalculating said local weighting matrix dependent on the detected motion;
   using the recalculated weighting matrix to reconstruct MR image data from the measured MR signals in the slice direction;
   using said local weighting matrix in said computer to reconstruct non-measured raw data points of said examination volume from the acquired measured MR signals; and
   making the image data available from the computer in electronic form, as a data file.

2. A method as claimed in claim 1, comprising acquiring said measured MR signals in a plurality of slices, and, in said computer, correcting said detected motion to maintain an anatomical structure unchanged in each slice of said plurality of slices before correcting said motion and, in the recalculated slices, after the motion correction.

3. A method as claimed in claim 2, comprising acquiring said MR reference data individually in each slice in said plurality of slices, and acquiring said measured MR signals from said plurality of slices in said slice direction simultaneously using a plurality of reception coils.

4. A method as claimed in claim 1, comprising detecting said motion in said examination volume after completion of acquisition of said measured MR signals in said slice direction.

5. A method as claimed in claim 1, comprising detecting said motion of said examination volume prior to completion of acquisition of said measured MR signals in said slice direction.

6. A method as claimed in claim 1, comprising:
   acquiring said measured MR signals from a plurality of slices of said examination volume simultaneously using a plurality of reception coils;
   generating said local weighting matrix as a slice separation matrix; and
   in said computer, using said slice separation matrix to separate the measured MR signals acquired from said plurality of slices into measured MR data for individual slices.

7. A method as claimed in claim 1, comprising using the measured MR signals to detect said motion.

8. A method as claimed in claim 1, comprising:
   operating a camera while said measured MR data are being acquired to obtain camera images of the examination volume; and
   using said camera images to detect said motion.

9. A method as claimed in claim 1, comprising using the measured MR signals in said computer to determine a temporal profile of an MR signal parameter in a portion of said examination volume.

10. A method as claimed in claim 1, comprising adjusting said examination volume dependent on the detected motion before terminating acquisition of said measured MR signals, and acquiring at least a portion of said measured MR signals using the adjusted examination volume.

11. A method as claimed in claim 1, comprising acquiring said measured MR signals in a first MR measurement and using the measured MR signals from said first MR measurement to determine whether motion of said examination volume is present; and
   only if motion of said examination volume is present, then acquiring measured MR signals in a second measurement, and using the measured MR signals from said second MR measurement to determine an amount of said motion.

12. A method as claimed in claim 1, comprising acquiring said reference data in a reference volume that is larger than said examination volume and that encompasses said examination volume.

13. A magnetic resonance (MR) imaging apparatus comprising:
   an MR data acquisition scanner;
   a computer configured to operate said MR data acquisition scanner to acquire MR reference data of an examination volume of a subject while the subject is situated in the MR data acquisition scanner;
   said computer being configured to operate said MR data acquisition apparatus to acquire measured MR signals from said examination volume with an accelerated MR data acquisition procedure that is accelerated in a slice direction;
   said computer being configured to use said MR reference data to determine a local weighting matrix, and using the local weighting matrix to extract MR data from the examination volume from the MR signals;
   said computer being configured to detect motion of the examination volume while the measured MR signals are being acquired from the examination volume, and determining whether said motion is larger than a limit value;
   said computer being configured, dependent on whether the detected motion is greater than said limit value, to recalculate said local weighting matrix dependent on the detected motion;
   said computer being configured to (i) use the recalculated weighting matrix to reconstruct MR image data from the measured MR signals in the slice direction, and (ii) use said local weighting matrix to reconstruct non-measured raw data points of said examination volume from the acquired measured MR signals; and
   said computer being configured to make the image data available from the computer in electronic form, as a data file.

14. A non-transitory, computer-readable data storage medium encoded with programming instructions, said storage medium being loaded into a computer or computer system of a magnetic resonance (MR) apparatus that comprises an MR data acquisition scanner, said programming instructions causing said computer or computer system to:

operate the MR data acquisition scanner to acquire MR reference data of an examination volume of a subject while the subject is situated in the MR data acquisition scanner;

operate the MR data acquisition apparatus to acquire measured MR signals from said examination volume with an accelerated MR data acquisition procedure that is accelerated in a slice direction;

use said MR reference data to determine a local weighting matrix, and using the local weighting matrix to extract MR data from the examination volume from the MR signals;

detect motion of the examination volume while the measured MR signals are being acquired from the examination volume, and determine whether said motion is larger than a limit value;

dependent on whether the detected motion is greater than said limit value, recalculate said local weighting matrix dependent on the detected motion;

use the recalculated weighting matrix to reconstruct MR image data from the measured MR signals in the slice direction;

use said local weighting matrix to reconstruct non-measured raw data points of said examination volume from the acquired measured MR signals; and make the image data available from the computer in electronic form, as a data file.

* * * * *